(12) United States Patent
Yin et al.

(10) Patent No.: US 8,889,554 B2
(45) Date of Patent: Nov. 18, 2014

(54) SEMICONDUCTOR STRUCTURE AND METHOD FOR MANUFACTURING THE SAME

(75) Inventors: Haizhou Yin, Poughkeepsie, NY (US); Wei Jiang, Beijing (CN); Zhijiong Luo, Poughkeepsie, NY (US); Huilong Zhu, Poughkeepsie, NY (US)

(73) Assignee: The Institue of Microelectronics Chinese Academy of Science, Beijing (CN)

( * ) Notice: Subject to any disclaimer, the term of this patent is extended or adjusted under 35 U.S.C. 154(b) by 127 days.

(21) Appl. No.: 13/380,486

(22) PCT Filed: Apr. 18, 2011

(86) PCT No.: PCT/CN2011/072956
§ 371 (c)(1),
(2), (4) Date: Aug. 20, 2012

(87) PCT Pub. No.: WO2012/119336
PCT Pub. Date: Sep. 13, 2012

(65) Prior Publication Data
US 2012/0319213 A1    Dec. 20, 2012

(30) Foreign Application Priority Data
Mar. 4, 2011 (CN) .......................... 2011 1 0053301

(51) Int. Cl.
*H01L 29/78* (2006.01)
*H01L 29/417* (2006.01)
*H01L 29/66* (2006.01)

(52) U.S. Cl.
CPC ........ *H01L 29/41775* (2013.01); *H04L 29/456* (2013.01); *H01L 29/6653* (2013.01); *H01L 29/6656* (2013.01); *H01L 29/66545* (2013.01)
USPC ........... 438/692; 438/300; 438/664; 438/197; 438/231; 438/303; 438/305; 438/655; 257/382; 257/377; 257/E21.438; 257/E29.155; 257/E21.296

(58) Field of Classification Search
CPC ................. H01L 29/6659; H01L 21/28518; H01L 21/28052
USPC ......... 438/300, 664, 197, 231, 305, 303, 655; 257/382, 377, 384
See application file for complete search history.

(56) References Cited

U.S. PATENT DOCUMENTS

| | | | |
|---|---|---|---|
| 7,544,575 B2 | 6/2009 | Adetutu et al. | |
| 7,629,655 B2 * | 12/2009 | Yu et al. | 257/377 |
| 2003/0183881 A1 * | 10/2003 | Lee et al. | 257/382 |
| 2007/0166937 A1 * | 7/2007 | Adetutu et al. | 438/300 |

FOREIGN PATENT DOCUMENTS

CN    101271897 A    9/2008

OTHER PUBLICATIONS

Office Action of CN 201010572608, dated May 9, 2013, Counterpart of U.S. Appl. No. 13/379,658.

* cited by examiner

*Primary Examiner* — Jerome Jackson, Jr.
*Assistant Examiner* — Bo Fan
(74) *Attorney, Agent, or Firm* — Treasure IP Group, LLC

(57) ABSTRACT

The present invention provides a method for manufacturing a semiconductor structure, comprising: forming a first contact layer on an exposed active region of a first spacer; forming a second spacer at a region of the first contact layer close to a gate stack to partially cover the exposed active region; forming a second contact layer in the uncovered exposed active region, wherein when a diffusion coefficient of the first contact layer is the same as that of the second contact layer, the first contact layer has a thickness less than that of the second contact layer; and when the diffusion coefficient of the first contact layer is different from that of the second contact layer, the diffusion coefficient of the first contact layer is smaller than that of the second contact layer. Correspondingly, the present invention also provides a semiconductor structure. The present invention is beneficial to the suppression of the diffusion of corresponding compositions from the contact layers into the channel region, reduction of the short channel effects, and improvement of the reliability of the semiconductor structure.

5 Claims, 6 Drawing Sheets

SEMICONDUCTOR STRUCTURE AND METHOD FOR MANUFACTURING THE SAME

CROSS REFERENCE TO RELATED APPLICATION

This application is a National Phase application of PCT Application No. PCT/CN2011/072956, filed on Apr. 18, 2011, entitled "semiconductor structure and method for manufacturing the same", which claimed priority to Chinese Application No. 201110053301.7, filed on Mar. 4, 2011. Both the PCT Application and the Chinese Application are incorporated herein by reference in their entireties.

FIELD OF THE INVENTION

This invention relates to semiconductor manufacturing, and particularly to a semiconductor structure and a method for manufacturing the same.

BACKGROUND OF THE INVENTION

The Metal-Oxide-Semiconductor Field-Effect Transistor (MOSFET) is a transistor that can be widely used in digital circuits and analog circuits.

FIG. 10 is a cross-sectional view of a conventional MOSFET device. As illustrated in FIG. 10, the MOSFET comprises a substrate 100, a source/drain region 110, a source/drain extension region 111, a gate stack and a spacer 240. Optionally, the MOSFET further comprises a shallow trench 120 for isolating adjacent MOSFET structures. The gate stack is formed on the substrate 100, and comprises a gate dielectric layer 210, a gate 220 and a cap layer 230. The source/drain region 110 is formed in the substrate 100 and located at both sides of the gate stack. The source/drain extension region 111 extends from the source/drain region 110 to approach the gate stack, with a thickness less than that of the source/drain region 110. The spacer 240 is located on sidewalls of the gate stack and covers the source/drain extension region 111. A contact layer 300 (beneficial to the reduction of the contact resistance) is provided on the source/drain region 110. For a Si-containing substrate, the contact layer 300 may be a metal silicide layer. In the following, the description is made by taking the Si-containing substrate as an example, and the contact layer is referred to as the metal silicide layer.

The contact layer is beneficial to the reduction of the contact resistance of the source/drain region. The Si-based semiconductor is taken as an example. As illustrated in FIG. 11, in a deep submicron CMOS device, the conventional materials of the metal silicide layer are $TiSi_2$ and $CoSi_2$. With a further decrease of the device size, especially when the technology node reaches about 90 nm, 65 nm and beyond, it is impossible for $TiSi_2$ and $CoSi_2$ to meet the requirement of lower contact resistance. At the technology node of about 65 nm and beyond, NiSi replaces $TiSi_2$ and $CoSi_2$ and becomes a new generation material of the contact layer. In Hiroshi Iwai, etc., "NiSi salicide technology for scaled CMOS" published in Microelectronic Engineering, the application of the NiSi self-aligned silicide technology in the CMOS process is introduced in detail. As compared with metal silicide such as $TiSi_2$ and $CoSi_2$, NiSi has advantages of low formation temperature (~400° C.), low silicon consumption in a silicification process and lower contact resistance. By adding a right amount of appropriate metal, such as Pt, and taking the Ni alloy silicide as the contact layer, the thermal stability of NiSi that forms a pseudo-binary solid-state solution can be improved, so that the device acquires an optimum performance.

The formation process of NiSi is different from that of $TiSi_2$ and $CoSi_2$, etc. During the silicification process, Ni diffuses into the silicon to form NiSi, while $TiSi_2$ etc. is formed by Si atoms diffusing into the metal to generate silicide. In the silicon, Ni has a higher diffusion coefficient than Ti, Co or Pt, etc. When Ni laterally diffuses into the channel region, a silicide layer is formed in the channel accordingly. As a result, shorts may easily occur in the channel, and cause failure of the semiconductor device.

Therefore, it is a problem urgently to be solved to reduce the Ni diffusion while the contact resistance meets the product requirement.

SUMMARY OF THE INVENTION

The object of the present invention is to provide a semiconductor structure and a method for manufacturing the same, so as to reduce the Ni diffusion while the contact resistance of the semiconductor structure meets the product requirement.

According to an aspect of the present invention, a method for manufacturing a semiconductor structure is provided. The method comprises:

providing a substrate, forming an active region on the substrate, and partially exposing the active region after sequentially forming a gate stack, forming a source/drain extension region and a first spacer surrounding the gate stack by taking the gate stack as a mask, and forming a source/drain region by taking the gate stack and the first spacer as a mask on the active region and;

forming a first contact layer on the exposed active region;

forming a second spacer at a region of the first contact layer close to the gate stack to partially cover the exposed active region;

forming a second contact layer in the uncovered exposed active region.

Another aspect of the present invention further provides a semiconductor structure, comprising a gate stack formed on a portion of an active region with other portions of the active region being exposed, the semiconductor structure further comprising:

a first contact layer and a second contact layer embedded in the active region, wherein the first contact layer at least covers a part of the active region, and the second contact layer adjoins the first contact layer; and the second contact layer is farther away from the gate stack than the first contact layer, and a diffusion coefficient of the first contact layer is smaller than that of the second contact layer.

As compared with the prior art, the invention has the following advantages:

According to the method provided in the present invention, the first contact layer is firstly formed on a portion of the exposed active region, and then the second contact layer is formed on other portions of the exposed active region after the second spacer is formed. Since the thickness of the first contact layer is less than that of the second contact layer when the diffusion coefficient of the first contact layer is the same as that of the second contact layer, and the diffusion coefficient of the first contact layer is smaller than that of the second contact layer when the diffusion coefficient of the first contact layer is different from that of the second contact layer, the diffusion source at a region close to the gate stack is further limited, which is beneficial to the suppression of the diffusion of corresponding compositions from each contact layer into the device channel region, and improvement of the performance of the semiconductor device.

In the semiconductor device provided in the present invention, since the second contact layer is farther away from the gate stack, and the diffusion coefficient of the first contact layer is smaller than that of the second contact layer, the diffusion source at a region close to the gate stack is further limited, which is beneficial to the suppression of the diffusion of corresponding compositions from each contact layer into the device channel region, and the improvement of the performance of the semiconductor device.

BRIEF DESCRIPTION OF THE DRAWINGS

Other features, objects and advantages of the present invention will be more apparent by reading the detailed descriptions of the non-restrictive embodiments made in reference to the following drawings.

DETAILED DESCRIPTION OF THE EMBODIMENTS

Figure 1:
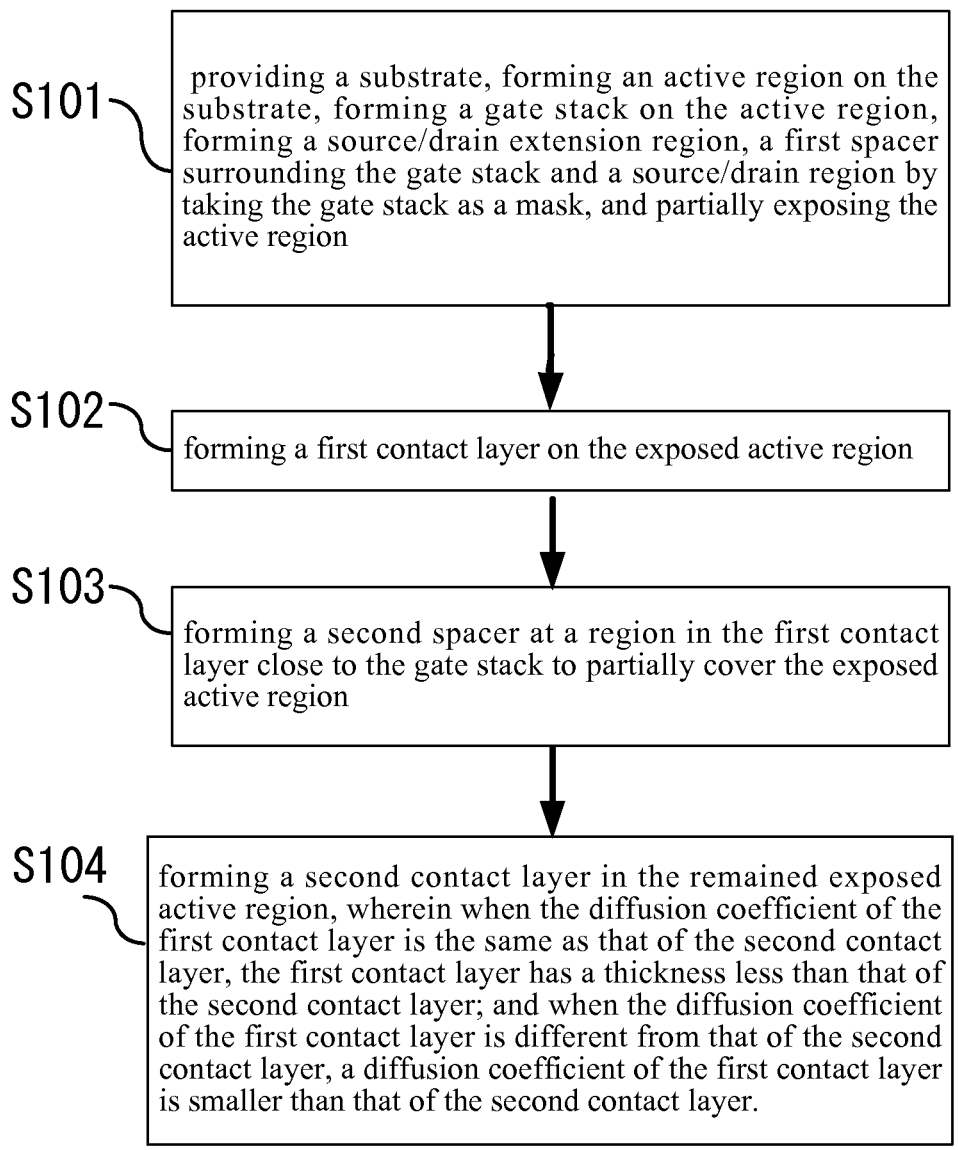
FIG. 1 is a flowchart of a method for manufacturing a semiconductor structure according to the present invention.

The embodiments of the present invention are described in detail as follows. The examples of the embodiments are illustrated in the drawings. The embodiments described as follows with reference to the drawings are exemplary, and are merely used to interpret the present invention rather than limiting the present invention.

The following disclosure provides many different embodiments or examples to implement different structures of the present invention. In order to simplify the disclosure of the present invention, the components and arrangements of specific examples are described in the following text. Apparently, they are just exemplary, and do not intend to restrict the present invention. In addition, reference numbers and/or letters can be repeated in different examples of the present invention for the purposes of simplification and clearness, without indicating the relationships between the discussed embodiments and/or arrangements. Furthermore, the present invention provides examples of various specific processes and materials, but a person skilled in the art can realize the availability of other processes and/or usage of other materials. To be noted, the components as illustrated in the drawings are not always drawn to scale. In the present invention, the descriptions of known assemblies as well as processing techniques and processes are omitted, so as to avoid any unnecessary restriction to the present invention.

In the following text, the method for manufacturing the semiconductor structure in FIG. 1 is described in detail in conjunction with FIGS. 2 to 9.

Figure 2:
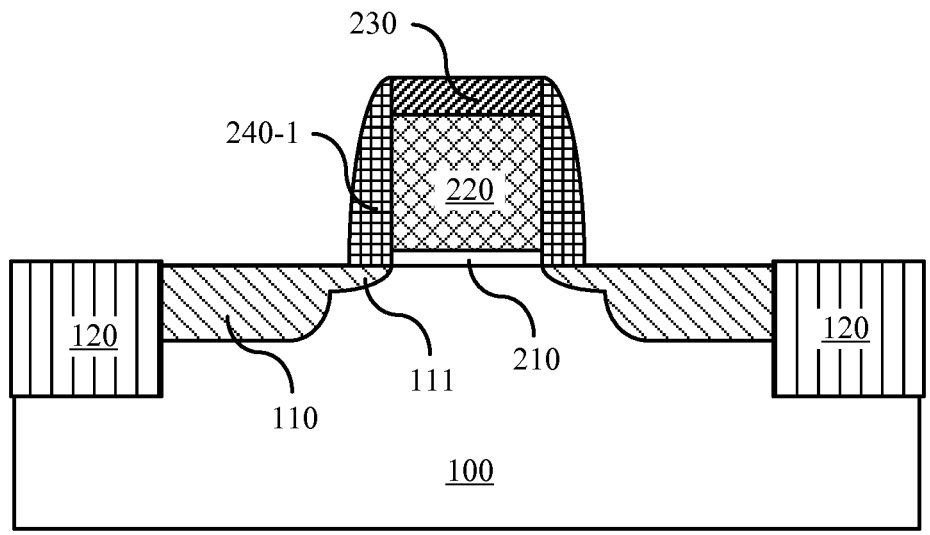
FIGS. 2 to 9 are cross-sectional views of a semiconductor structure at respective stages, wherein the semiconductor structure is manufactured in the flow as illustrated in FIG. 1 according to a preferred embodiment of the present invention.
Figure 3:
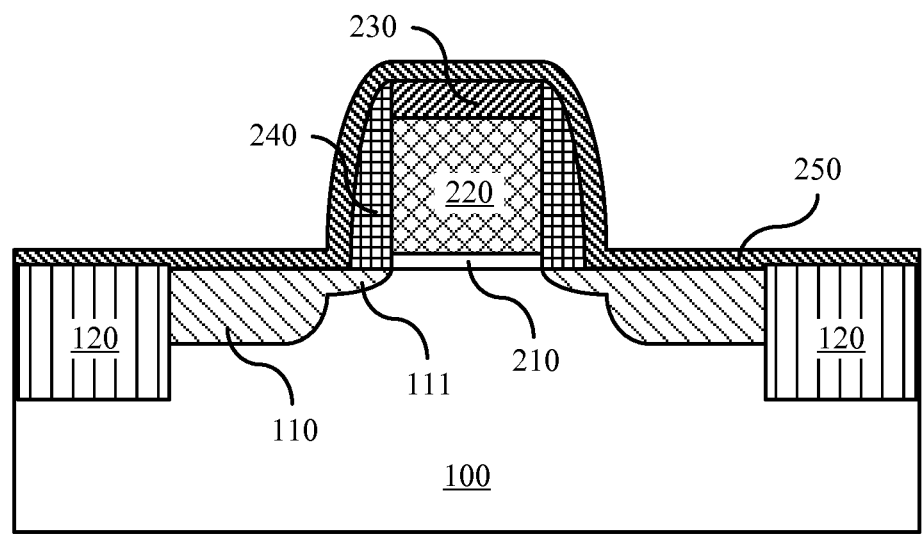

Referring to FIGS. 1 and 2, in step S101, a substrate 100 is provided and an active region (not illustrated in the drawings) is formed thereon. The active region is a substrate region formed by doping for making the semiconductor structure. A gate stack is formed on the active region. The active region is partially exposed after forming a source/drain extension region 111, a first spacer 240-1 surrounding the gate stack and a source/drain region 110 by taking the gate stack as a mask. The gate stack comprises a gate dielectric layer 210, a gate 220 and a cap layer 230.

In this embodiment, the substrate 100 comprises a silicon substrate (for example, a silicon wafer). According to the design requirement known in the prior art (for example, a P-type substrate or an N-type substrate), the substrate 100 can comprise various doped configurations. In other embodiments, the substrate 100 may further comprise other basic semiconductors (for example, group III-V materials), such as germanium. Alternatively, the substrate 100 may comprise a compound semiconductor, such as silicon carbide, gallium arsenide or indium arsenide. Typically, the substrate 100 may have, but not limited to, a thickness of several hundreds of micrometers, e.g., within a thickness range of about 400 μm-800 μm.

An isolation region, e.g., a shallow trench isolation (STI) structure 120, is formed in the substrate 100, so as to electrically isolate continuous field effect transistors.

When a gate stack is to be formed, a gate dielectric layer 210 is firstly formed on the substrate 100. In this embodiment, the gate dielectric layer 210 may be formed of silicon oxide or silicon nitride, or a combination thereof. In other embodiments, the gate dielectric layer 210 may also be formed of a high-K dielectric, such as one of $HfO_2$, HfSiO, HfSiON, HfTaO, HfTiO, HfZrO, $Al_2O_3$, $La_2O_3$, $ZrO_2$ and LaAlO, or combinations thereof, with a thickness of about 2-10 nm, e.g., 5 nm or 8 nm. The gate may be heavily doped polycrystalline silicon formed by deposition. Alternatively, the gate is formed by firstly forming a work function metal layer (e.g., TaC, TiN, TaTbN, TaErN, TaYbN, TaSiN, HfSiN, MoSiN, $RuTa_x$ or $NiTa_x$, etc. for an NMOS, and $MoN_x$, TiSiN, TiCN, TaAlC, TiAlN, TaN, $PtSi_x$, $Ni_3Si$, Pt, Ru, Ir, Mo, HfRu, or $RuO_x$, etc. for a PMOS) with a thickness of about 1 nm-20 nm (e.g., 3 nm, 5 nm, 8 nm, 10 nm, 12 nm or 15 nm), and then forming heavily doped polycrystalline silicon, Ti, Co, Ni, Al or W or their alloys, etc. on the work function metal layer to form the gate 220. Finally, a cap layer 230 is formed on the gate 220, for example, by depositing silicon nitride, silicon oxide, silicon oxynitride or silicon carbide, or combinations thereof, for protecting a top region of the gate 220.

In some other embodiments of the present invention, a gate-last process may also be adopted when step S101 is performed. In such a case, the gate stack comprises a gate 220 (which is referred as a dummy gate) and a gate dielectric layer 210 bearing the gate. The gate 220 (which is referred as a dummy gate) is formed by depositing, for example, polycrystalline silicon, polycrystalline SiGe, noncrystalline silicon, doped or undoped silicon oxide, silicon nitride, silicon oxynitride, silicon carbide or even metals on the gate dielectric layer 210, and a thickness thereof may be about 10-80 nm. Finally, a cap layer 230 is formed on the gate 220 (which is referred as a dummy gate), for example, by depositing silicon nitride, silicon oxide, silicon oxynitride or silicon carbide, or combinations thereof, for protecting the top of the dummy gate 220, and preventing the top of the gate 220 (which is referred as a dummy gate) from reacting with the deposited metal layer in a subsequent process of forming the contact layer. In another embodiment adopting the gate last process, the gate stack may not have the gate dielectric layer 210, and the gate dielectric layer 210 is formed after the dummy gate is removed in a subsequent process step and before the work function metal layer is filled.

After the gate stack is formed, firstly, a relatively shallow source/drain extension region 111 is formed in the substrate 100 by low energy implantation. P-type or N-type dopants or impurities may be implanted into the substrate 100. For example, for a PMOS, the source/drain extension region 111 may be P-type doped Si; and for an NMOS, the source/drain extension region 111 may be N-type doped Si. Next, the semiconductor structure is subjected to an annealing to activate the dopants in the source/drain extension region 111. The annealing may be performed by other appropriate methods including rapid annealing and spike annealing. Since the source/drain extension region 111 is relatively shallow in thickness, the short channel effects can be effectively suppressed.

Next, a first spacer 240-1 is formed on sidewalls of the gate stack to isolate the gate. The first spacer 240-1 may be formed of silicon nitride, silicon oxide, silicon oxynitride or silicon carbide, or combinations thereof, and/or other appropriate materials. The first spacer 240-1 may have a multilayer structure. The first spacer 240-1 may be formed by processes including depositing and etching, with a thickness of about 10 nm-100 nm, such as 30 nm, 50 nm or 80 nm.

Subsequently, the first spacer 240-1 is taken as a mask, and the P-type or N-type dopants or impurities are implanted into the substrate 100, so as to form the source/drain region 110 at both sides of the gate stack. For example, for a PMOS, the source/drain region 110 may be P-type doped Si; and for an NMOS, the source/drain region 110 may be N-type doped Si. The implantation energy for forming the source/drain region 110 is larger than that for forming the source/drain extension region 111. Therefore, the formed source/drain region 110 has a thickness greater than that of the source/drain extension region 111, and presents a scalariform profile with respect to the source/drain extension region 111. Afterwards, the semiconductor structure is subjected to annealing so as to activate the dopants in the source/drain region 110. The annealing may be performed by other appropriate methods including rapid annealing and spike annealing.

Optionally, in step S101, the first spacer 240-1 is partially removed to expose at least a part of the active region (which may be a part of the source/drain extension region 111 in this embodiment, as illustrated in FIG. 2) covered by the first spacer 240-1. Specifically, the processes including wet etching and/or dry etching may be used to partially remove the first spacer 240-1, so as to partially expose the active region under the first spacer 240-1. Tetramethylammonium hydroxide (TMAH), potassium hydroxide (KOH) or other solutions suitable for etching may be used in the wet etching process. Sulfur hexafluoride ($SF_6$), hydrogen bromide (HBr), hydrogen iodide (HI), chlorine, argon, helium, hydrides of carbon such as methane (and methyl chloride), acethlene, ethylene and combinations thereof, and/or other appropriate materials may be used in the dry etching process.

In some other embodiments of the present invention, the dummy gate stack is formed by the gate last process. In case the dummy gate is made of an insulation material (e.g., silicon oxide and silicon nitride) that will not react with the deposited metal layer, it is possible to completely remove the first spacer 240-1, so as to maximize the region where the active region reacts with the deposited metal, thereby reducing the contact resistance between the active region and the contact layer. In case the dummy gate is made of Si or metal, the first spacer 240-1 has to be partially removed, so as not to influence the size of the dummy gate stack by a difficult separation of the metal for forming a first contact layer and the metal as the dummy gate in subsequent processes, and thus prevent the size of the gate stack structure formed after the gate last process from being influenced.

In step S102, a first contact layer 300 is formed in the active region not covered by the gate stack or the spacer, including the source/drain region 110, and/or the source/drain extension region 111 exposed after partially or completely removing the spacer 240-1. Specifically, referring to FIG. 3, a first metal layer 250 is deposited to evenly cover the substrate 100 and the gate stack. The first metal layer 250 is made of a material having a relatively small diffusion coefficient in the substrate 100, and may be one of Ti, Pt and Co, or combinations thereof. After the annealing, the first contact layer 300 is formed in the active region not covered by the gate stack or the spacer. For example, in case the substrate 100 is made of silicon, the first contact layer 300 may be made of one of $TiSi_2$, $PtSi_2$ and $CoSi_2$, or combinations thereof.

Figure 4:
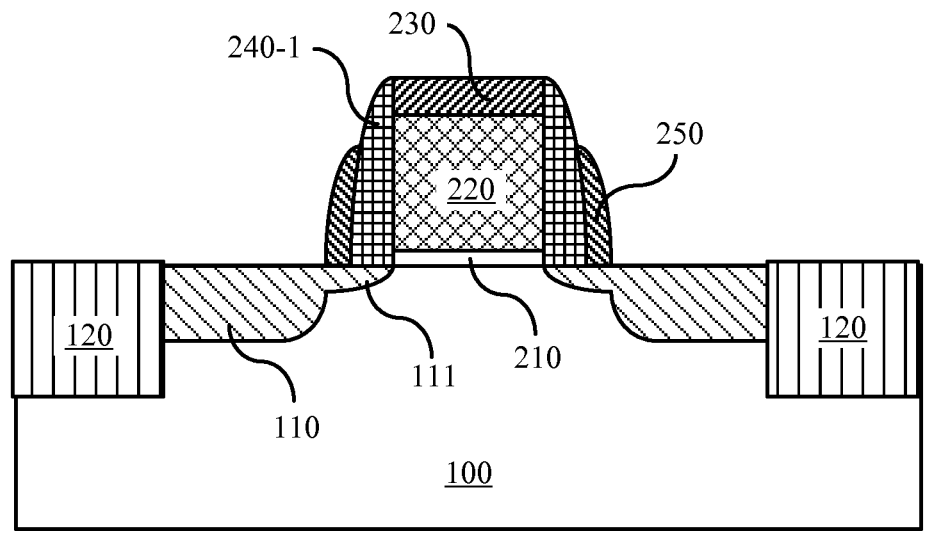
Figure 5:
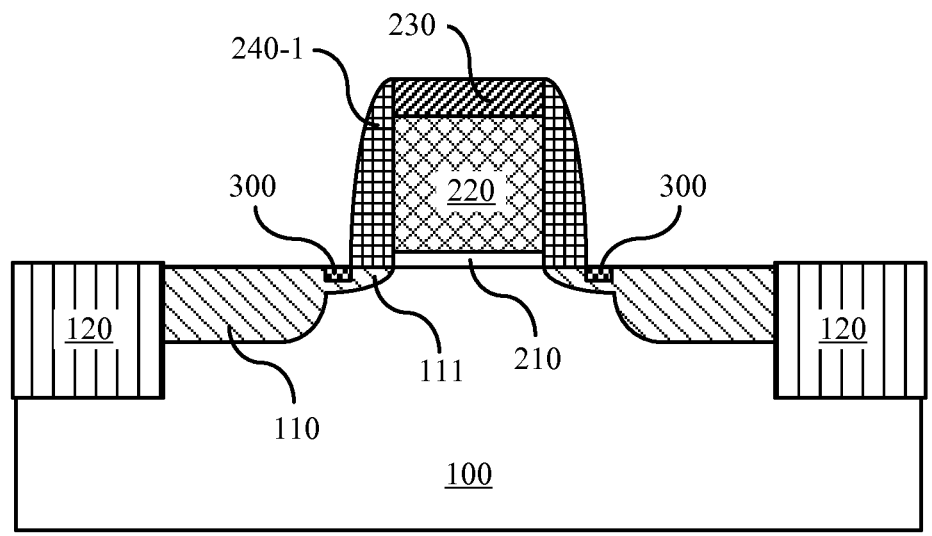

Preferably, in this embodiment, referring to FIG. 4, the process step before the annealing further comprises: etching the first metal layer 250 in an etching process, and only keeping the metal on a sidewall of the first spacer 240-1 to form a metal sidewall. Next, an annealing operation is carried out, as illustrated in FIG. 5, and the first contact layer 300 is formed at a position in the active region close to the gate stack. That is to say, in this embodiment, the first contact layer 300 may only cover a part of the source/drain region 110 that adjoins the source/drain extension region 111 by controlling process parameters (e.g., the thickness of the first metal layer 250 and the etching of the first metal layer 250). In some other embodiments of the present invention, when the first spacer 240-1 is partially or completely removed, the first contact layer 300 may cover at least a part of the source/drain extension region 111, or at least a part of the source/drain extension region 111 and a part of the source/drain region 110 that adjoins the source/drain extension region 111. In other embodiments of the present invention, the metal spacer may not be formed, and the first contact layer 300 is formed on the whole exposed active region.

By selecting the thickness and the material of the deposited first metal layer 250, the formed first contact layer 300 may still have thermal stability at a higher temperature (such as 850° C.), so as to maintain a low resistivity, which is beneficial to suppress increase of the resistivity of the first contact layer 300 caused by high temperature annealing in the subsequent semiconductor structure manufacturing process. In addition, the material of the first metal layer 250 has a small diffusion coefficient in the substrate 100, thus the metal atoms are difficult to transversely diffuse into the channel, which is beneficial to reduction of shorts in the channel and device failure. In order to acquire a thermal-stable first contact layer 300, the thickness of the first metal layer is selected to be less than 5 nm, or the thickness of the formed first contact layer 300 is selected to be less than 10 nm.

In the end of step S102, the un-reacted first metal layer 250 in formation of the first contact layer 300 is removed by a selective etching.

In other embodiments of the present invention, the first contact layer 300 may only cover the whole source/drain region 110, i.e., the step of partially removing the first spacer 240-1 may be omitted after formation of the first spacer 240-1, and the first contact layer 300 is directly formed on the exposed active region instead. At that time, the exposed active region is the source/drain region 110. Alternatively, the step of partially removing the first spacer 240-1 may be omitted after formation of the first spacer 240-1, and a metal spacer is directly formed on the sidewall of the first spacer 240-1 instead. At that time, the first contact layer 300 formed using the metal spacer is only located on the source/drain region 110.

Figure 6:
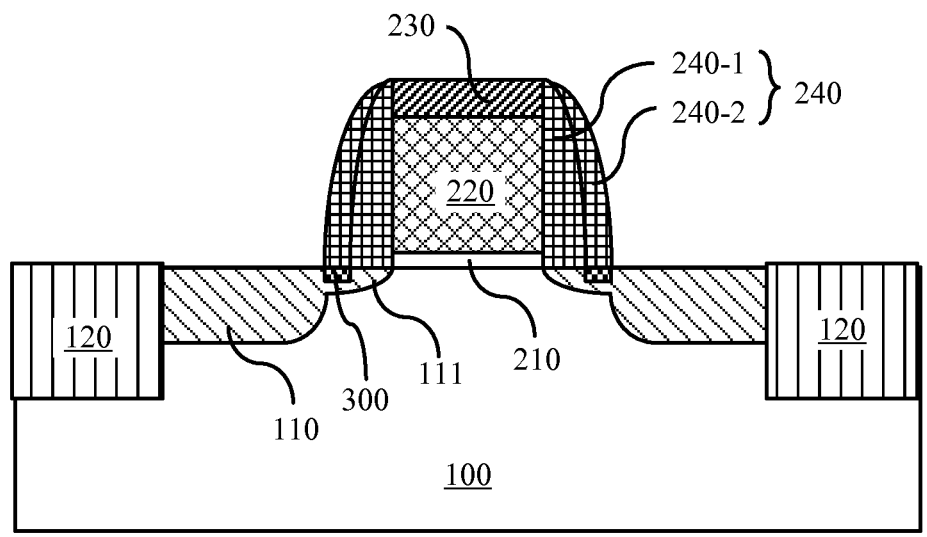

Referring to FIGS. 1 and 6, in step S103, a second spacer 240-2 is formed on an outer side of the first spacer 240-1. The second spacer 240-2 may be formed of silicon nitride, silicon oxide, silicon oxynitride or silicon carbide, or combinations thereof, and/or other appropriate materials. The second spacer 240-2 may have a multilayer structure. The second spacer 240-2 may be formed by the process including depositing and etching, with a thickness of about 10 nm-100 nm, such as 30 nm, 50 nm or 80 nm. The material of the second spacer 240-2 may be the same as or different from that of the first spacer 240-1. In this embodiment, the first spacer 240-1 is partially removed, and the second spacer 240-2 partially or completely covers the source/drain extension region 111. In other embodiments of the present invention, in case the first spacer 240-1 is completely removed, the second spacer 240-2 may cover at least a part of the source/drain extension region 111, or cover the whole source/drain extension region 111 and a part of the source/drain region 110 that adjoins the source/drain extension region 111. In case the first spacer 240-1 is not removed, the second spacer 240-2 only covers a part of the source/drain region 110.

Herein the first spacer 240-1 and the second spacer 240-2 together serve as the spacer 240 of the gate stack. In some other embodiments of the present invention, the first spacer 240-1 may be completely removed, and in that case the spacer 240 only comprises the second spacer 240-2.

Figure 7:
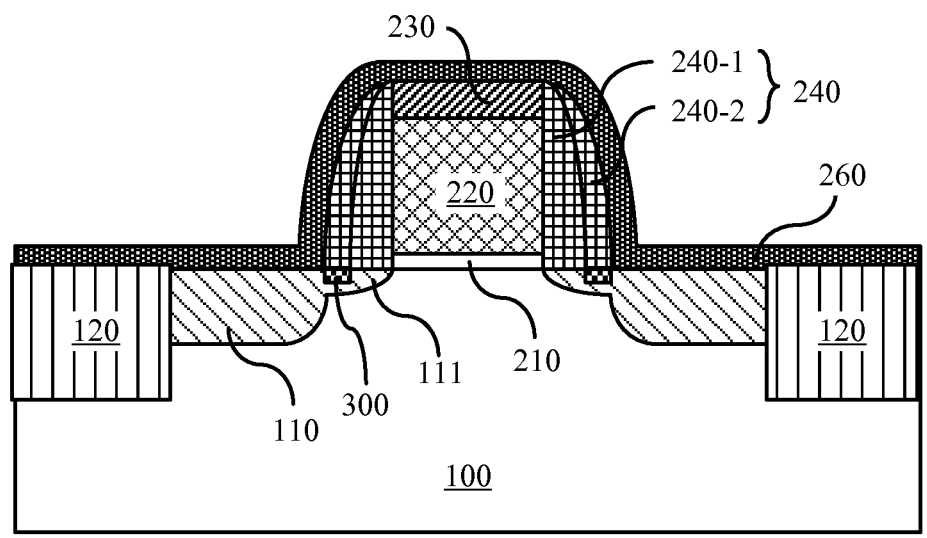
Figure 8:
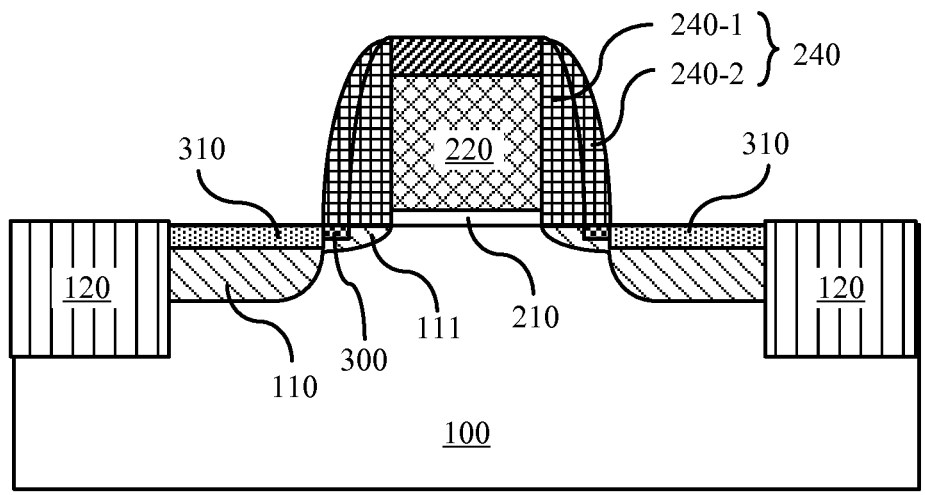

Referring to FIGS. 1, 7 and 8, step S104 is performed to form a second contact layer 310 on the remaining exposed active region. Specifically, referring to FIG. 7, a second metal layer 260 is deposited to evenly cover the substrate 100, the gate stack and the spacer 240. As illustrated in FIG. 8, after an annealing, the second contact layer 310 is formed in the active region not covered by the gate stack and the spacer 240. When the diffusion coefficient of the first contact layer 300 is the same as that of the second contact layer 310, the thickness of the first contact layer 300 will be less than that of the second contact layer 310; and when the diffusion coefficient of the first contact layer 300 is different from that of the second contact layer 310, the diffusion coefficient of the first contact layer 300 will be smaller than that of the second contact layer 310. In addition, when the diffusion coefficient of the first contact layer 300 is different from that of the second contact layer 310, the thickness of the first contact layer 300 may also be less than that of the second contact layer 310.

The second metal layer 260 may be made of Ni or Ni alloy such as NiPt alloy. In order to acquire a thermal-stable second contact layer 310, the material of the second metal layer may be Ni with a thickness less than 4 nm; or the second metal layer may be made of NiPt with a thickness less than 3 nm and a percentage of Pt less than 5% in weight; or the formed second contact layer 310 has a thickness less than 10 nm, and preferably less than 6 nm. Since the second contact layer 310 is farther away from the gate stack than the first contact layer 300, Ni is more difficult to diffuse into the channel, which is beneficial to the improvement of the reliability of the semiconductor device. Even if the diffusion coefficient of the first contact layer 300 is the same as that of the second contact layer 310, a diffusion source at the position close to the gate stack can be further restricted by making the thickness of the first contact layer 300 be less than that of the second contact layer 310, which is beneficial to suppress the diffusion of respective compositions from each of the contact layers into the device channel, thereby improving the performance of the semiconductor device.

In this embodiment, the second contact layer 310 adjoins the first contact layer 300, and is farther away from the gate stack than the first contact layer 300. The second contact layer 310 covers the whole source/drain region 110.

In other embodiments of the present invention, according to the relative positional relationships between the spacer 240, the first contact layer 300, the source/drain region 110 and the source/drain extension region 111, the second contact layer 310 may further cover a part of the source/drain region 110, or cover the whole source/drain region 110 and a part of the source/drain extension region 111.

Particularly, in other embodiments of the present invention, when the first contact layer 300 covers at least the whole source/drain region 110, the second contact layer 310 is formed on a part of the first contact layer 300 through a reaction between the second metal layer 260 and the first contact layer or the first contact layer and the semiconductor substrate 100.

Figure 9:
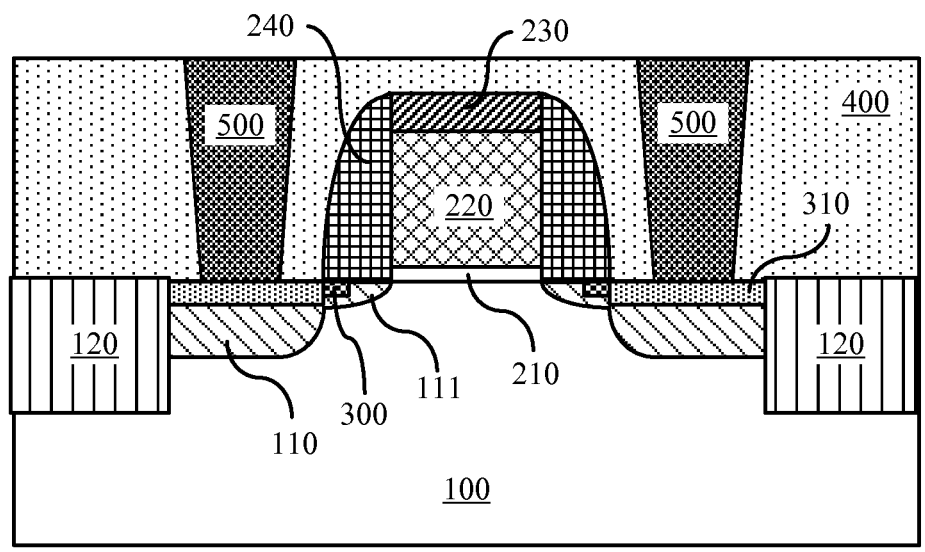
Figure 10:
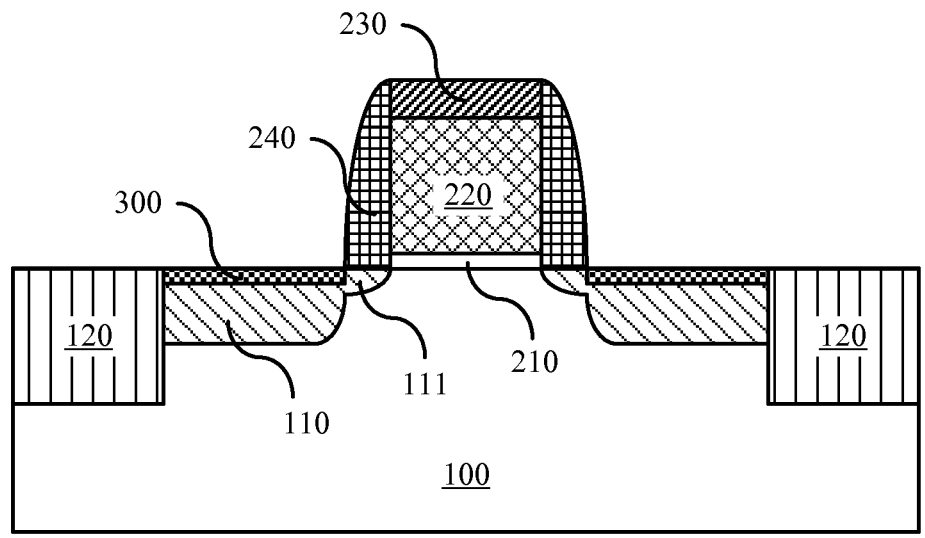
FIG. 10 is a cross-sectional view of a MOSFET device in the prior art.
Figure 11:
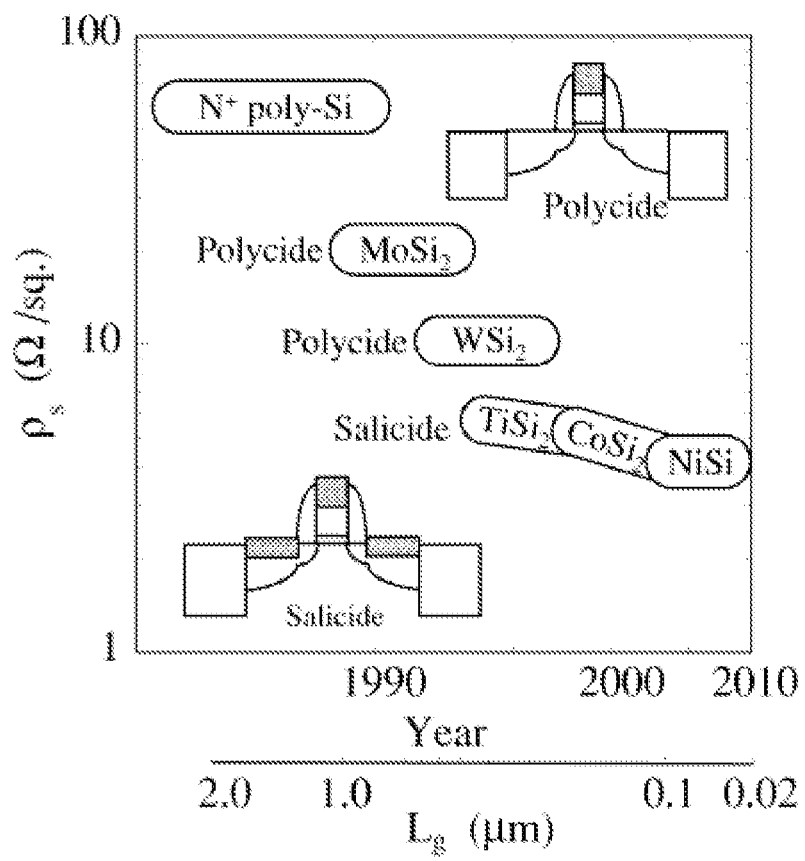
FIG. 11 is a development history of the material of a metal silicide contact layer used in a Si-based semiconductor device in the prior art.

Subsequently, the semiconductor structure is manufactured in the steps of the conventional semiconductor manufacturing process. As illustrated in FIG. 9, an interlayer dielectric layer 400 is deposited on the substrate of the semiconductor structure and then etched to form contact holes. The contact holes are filled with contact metals to form contact plugs 500. In some other embodiments of the present invention that adopt the gate last process, the interlayer dielectric layer 400 is deposited after step S104, then a replacement gate process is performed and the high-K gate dielectric layer is subjected to an annealing; next, the interlayer dielectric layer is etched to form contact holes, which are filled with the contact metal to form contact plugs. Since the above conventional manufacturing processes are known to a person skilled in the art, herein are not described.

The present invention further provides a semiconductor structure, comprising a gate stack formed on an active region and exposing the remained active region. The semiconductor structure further comprising:

first and second contact layers embedded in the active region, wherein the first contact layer at least covers a part of the active region, and the second contact layer adjoins the first contact layer; and the second contact layer is farther away from the gate stack than the first contact layer, and a diffusion coefficient of the first contact layer is smaller than that of the second contact layer.

The first contact layer is made of a material comprising one of TiSi, PtSi and $CoSi_2$, or combinations thereof. Preferably, when the active region is made of silicon, the second contact layer is made of NiSi or $Ni(POSi_{2-y})$. Preferably, when the second contact layer is made of $Ni(POSi_{2-y})$, an atomic percent of Pt is less than 5%. Preferably, the thickness of the second contact layer is smaller than 10 nm. Preferably, the first contact layer has a thickness smaller than that of the second contact layer.

The structure component, materials and manufacturing method for each part in embodiments of the semiconductor device may be the same as those in the aforementioned embodiments of the method for manufacturing the semiconductor device, and therefore are not repeated here.

Although the exemplary embodiments and their advantages have been described in detail herein, it shall be appreciated that various changes, substitutions and modifications may be made to these embodiments without deviating from the spirit of the present invention and the protection scopes defined by the accompanied claims. With respect to other examples, it shall be easily understood by a person skilled in the art that the sequence of the process steps may be changed while maintaining the protection scope of the present invention.

Furthermore, the application scope of the present invention is not limited to the processes, structures, manufacturing, compositions, means, methods and steps of the specific embodiments as described in the specification. According to the disclosure of the present invention, a person skilled in the art will easily understood that, when the processes, structures, manufacturing, compositions, means, methods and steps currently existing or to be developed in future are adopted to perform functions substantially the same as corresponding embodiments described in the present invention, or achieve substantially the same effects, a person skilled in the art can apply them according to the present invention. Therefore, the accompanied claims of the present invention intend to include the processes, structures, manufacturing, compositions, means, methods and steps within its protection scope.

What is claimed is:

1. A method for manufacturing a semiconductor structure, comprising:
   providing a substrate, wherein the substrate is made of silicon, forming an active region on the substrate, sequentially forming a gate stack, a source/drain extension region with the gate stack as a mask, a first spacer surrounding the gate stack, and a source/drain region by taking the gate stack and the first spacer as a mask on the active region, and then partially exposing the active region;
   forming a metal spacer at a position of the exposed active region close to the gate stack, wherein the metal spacer is made of a material comprising one of Ti, Pt and Co, or combinations thereof;
   performing an annealing operation so that the metal spacer reacts with a surface of the active region that supports the metal spacer to form the first contact layer; and
   removing the un-reacted metal spacer;
   forming a second spacer at a region of the first contact layer close to the gate stack to partially cover the exposed active region; and
   forming a second contact layer in the uncovered exposed active region, wherein the first contact layer has a thickness less than that of the second contact layer, the second contact layer is made of NiSi or Ni(Pt)Si2-y.

2. The method according to claim 1, further comprising removing at least a part of the first spacer between the steps of partially exposing the active region and forming the first contact layer.

3. The method according to claim 1, wherein when the diffusion coefficient of the first contact layer is different from that of the second contact layer, the first contact layer has a thickness less than that of the second contact layer.

4. The method according to claim 1, wherein when the second contact layer is made of Ni(Pt)Si2-y, an atomic percent of Pt is less than 5%.

5. The method according to claim 1, wherein the second contact layer has a thickness less than 10 nm.

* * * * *